US 6,521,990 B2

(12) United States Patent
Roh et al.

(10) Patent No.: US 6,521,990 B2
(45) Date of Patent: Feb. 18, 2003

(54) BALL GRID ARRAY PACKAGE COMPRISING A HEAT SINK

(75) Inventors: Kwon-Young Roh, Seoul (KR); Dong-Suk Kim, Kyungki-do (KR)

(73) Assignee: Samsung Electronics Co., Ltd., Hwasung (KR)

(*) Notice: Subject to any disclaimer, the term of this patent is extended or adjusted under 35 U.S.C. 154(b) by 0 days.

(21) Appl. No.: 09/995,293

(22) Filed: Nov. 27, 2001

(65) Prior Publication Data

US 2002/0084524 A1 Jul. 4, 2002

(30) Foreign Application Priority Data

Jan. 4, 2001 (KR) .............................. 2001-340

(51) Int. Cl.[7] .......................... H01L 23/10; H01L 23/34
(52) U.S. Cl. ...................... 257/706; 257/707; 257/698
(58) Field of Search ................................ 257/706, 707, 257/778, 698, 730

(56) References Cited

U.S. PATENT DOCUMENTS

| | | | |
|---|---|---|---|
| 4,922,324 A | * | 5/1990 | Sudo |
| 5,018,004 A | * | 5/1991 | Okinaga et al. |
| 5,543,663 A | * | 8/1996 | Takubo |
| 5,714,801 A | * | 2/1998 | Yano et al. |
| 6,058,013 A | * | 5/2000 | Christopher et al. |
| 6,351,194 B2 | * | 2/2002 | Takahashi et al. |

FOREIGN PATENT DOCUMENTS

| | | | |
|---|---|---|---|
| JP | 5-826686 | * | 4/1993 |
| JP | 6-232287 | * | 8/1994 |

* cited by examiner

Primary Examiner—Sheila V. Clark
(74) Attorney, Agent, or Firm—Marger Johnson & McCollom, P.C

(57) ABSTRACT

A semiconductor package comprises a semiconductor chip and a printed circuit board. The printed circuit board comprises a board body. An upper wiring layer is formed on the upper surface of the board body and includes a chip-mounting portion for mounting the semiconductor chip, board pads formed around the chip-mounting portion and electrically connected to said semiconductor chip, and an upper heat dissipation layer around said chip-mounting portion. Further, a lower wiring layer including a lower heat dissipation layer is formed on the lower surface of the board body. First heat-dissipating via holes are formed through the board body between the chip-mounting portion and the lower heat dissipation layer and are filled with a thermally conductive material for dissipating heat from the chip through the board body to the lower wiring layer. Second heat-dissipating via holes are formed through the board body below said upper heat dissipation layer and are filled with a thermally conductive material for dissipating heat generated from the chip through the board body to the upper heat dissipation layer.

14 Claims, 2 Drawing Sheets

BALL GRID ARRAY PACKAGE COMPRISING A HEAT SINK

This application relies for priority upon Korean Patent Application No. 2001-340, filed on Jan. 4, 2001, the contents of which are herein incorporated by reference in their entirety.

BACKGROUND OF THE INVENTION

1. Field of the Invention

The present invention relates to the field of semiconductor manufacturing and, more particularly, to a ball grid array (BGA) package including a heat sink.

2. Description of the Related Art

A transistor is a basic unit of integrated circuits on a semiconductor chip. As the number of transistors on a single semiconductor chip increases several problems arise due to heat dissipation. That is, heat is inevitably generated during the operation of integrated circuit devices.

As the number of gates increases, the generated heat also increases and damages the chip, shortening the lifetime of the semiconductor chip. For every 10° C. increase in the temperature of the semiconductor chips, the failure rate of the chips doubles. In the case of a CMOS semiconductor chip, the clock speed also decreases by 1 MHz. Therefore, removal or dissipation of the heat from the devices more and more important.

In the conventional semiconductor package, the heat generated from the semiconductor chip is emitted through two routes. The first route is through external connection terminals of the package and the second route is through the surface of the package. In order to more effectively dissipate the heat, a heat sink can be attached to the package. In a ball grid array (BGA) package including an encapsulating resin formed by molding semiconductor chip with a plastic resin, the heat sink is attached directly to the encapsulating resin of the package. In this case, the heat generated from the chip is conducted to the heat sink via the encapsulant and dissipated to the outside by convection.

Since the encapsulating resin has poor thermal conductivity, heat cannot be effectively dissipated through the heat sink attached to the encapsulating resin.

SUMMARY OF THE INVENTION

The present invention contemplates a semiconductor package structure that more effectively dissipates the heat generated by the semiconductor chip.

According to an embodiment of the present invention, a semiconductor package comprises a semiconductor chip and a printed circuit board. The printed circuit board comprises a board body. An upper wiring layer is formed on the upper surface of the board body and includes a chip-mounting portion for mounting the semiconductor chip, board pads formed around the chip-mounting portion and electrically connected to said semiconductor chip, and an upper heat dissipation layer around said chip-mounting portion. Further, a lower wiring layer including a lower heat dissipation layer is formed on the lower surface of the board body. First heat-dissipating via holes are formed through the board body between the chip-mounting portion and the lower heat dissipation layer and are filled with a thermally conductive material for dissipating heat from the chip through the board body toward the lower wiring layer. Second heat-dissipating via holes are formed through the board body below said upper heat dissipation layer and are filled with a thermally conductive material for dissipating heat generated from the chip through the board body toward the upper heat dissipation layer.

BRIEF DESCRIPTION OF THE DRAWINGS

These and other objects, features and advantages of the present invention will be readily understood with reference to the following detailed description provided in conjunction with the accompanying drawings, wherein like reference numerals designate like structural elements, and, in which.

DETAILED DESCRIPTION OF THE PREFERRED EMBODIMENTS

Preferred embodiments of the present invention will be described below with reference to the accompanying drawings.

Figure 1:
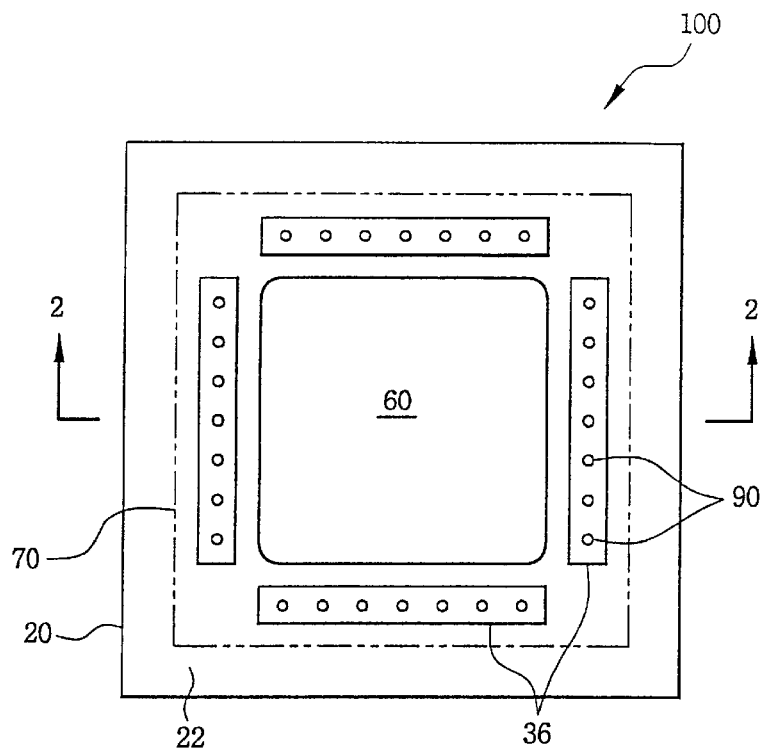
FIG. 1 is a plan view of a BGA package in accordance with one embodiment of the present invention, showing an upper heat dissipation layer discontinuously disposed on the periphery of an encapsulant.
Figure 2:
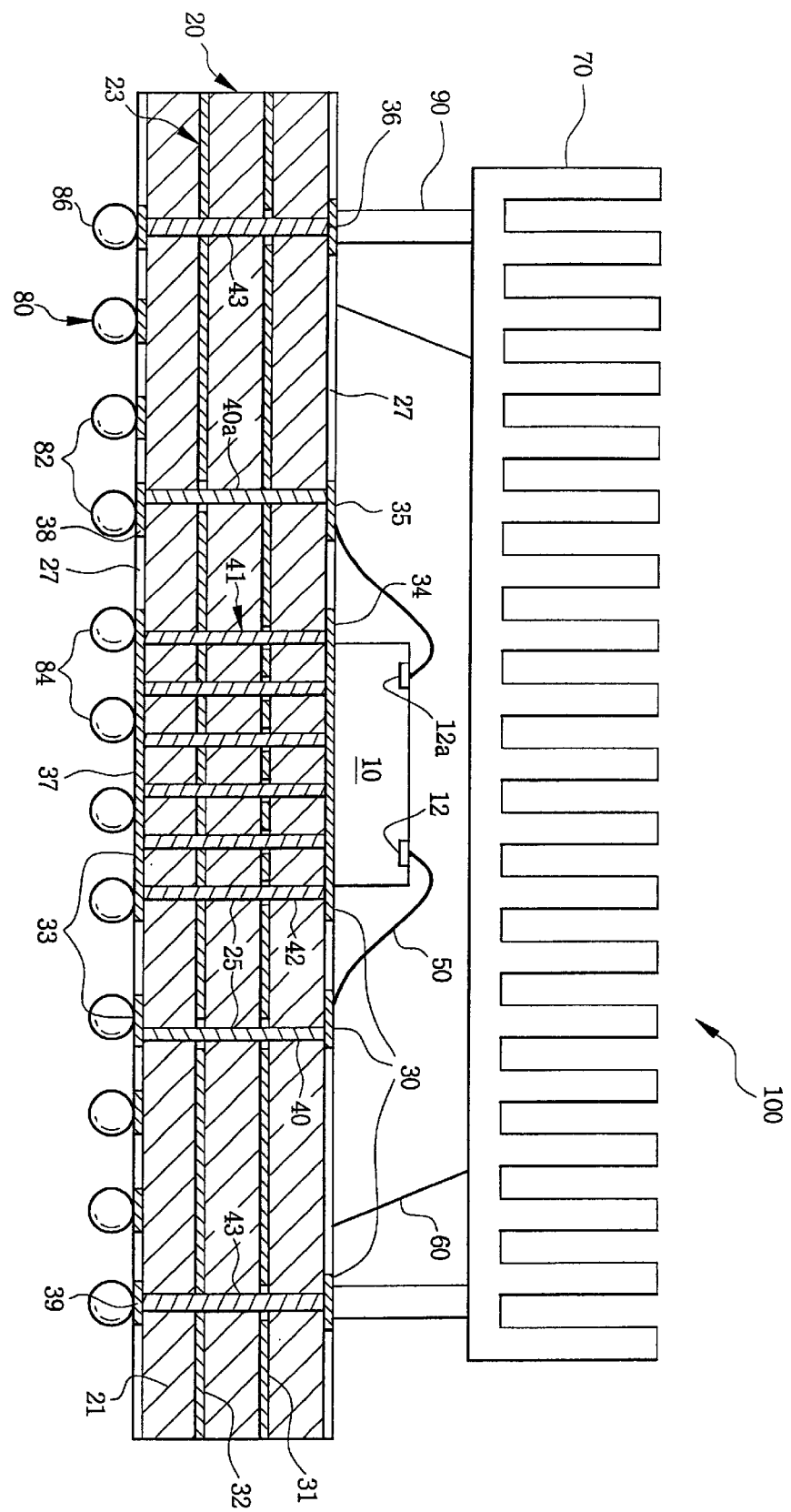
FIG. 2 is a cross-sectional view taken along the line 2—2 in FIG. 1, showing the upper heat dissipation layer connected to a heat sink by interposing a thermally conductive member therebetween.

FIG. 1 is a plan view of a ball grid array (BGA) package 100 in accordance with one embodiment of the present invention, showing an upper heat dissipation layer 36 discontinuously disposed on the periphery of an electrically insulating encapsulant 60. The encapsulant 60 is preferably comprised of a plastic resin. FIG. 2 is a cross-sectional view taken along the line 2—2 in FIG. 1, showing the upper heat dissipation layer 36 connected to a heat sink 70 by interposing a thermally conductive material 90 therebetween.

As shown in FIG. 1 and FIG. 2, the BGA package 100 comprises a multi-layered printed circuit board 20 having a chip-mounting portion 34 and wiring pattern layers 23, a semiconductor chip 10 attached to the chip-mounting portion 34, electrical connection means such as bonding wires 50 for electrically connecting the semiconductor chip 10 to the wiring pattern layers 23, the encapsulant 60 such as an encapsulating resin for encapsulating the semiconductor chip 10 and the bonding wires 50, and external connection terminals such as solder balls 80. The heat sink 70 is attached to the upper surface of the encapsulant 60.

The printed circuit board 20 comprises a board body 21 having an upper surface 22 and a lower surface 24, and the multi-layered wiring pattern layers 23 on the board body 21. The board body 21 is formed of an insulating plate such as a glass-epoxy resin or a BT resin. The wiring pattern layers 23 comprise an upper wiring layer 30 formed on the upper surface 22 of the board body 20, a lower wiring layer 33 formed on the lower surface 24 of the board body 20, a power layer 31 and a ground layer 32 formed within the board body 21. The upper wiring layer 30 and the lower wiring layer 33 are interconnected by via holes 25 perforating the board body 21. The multi-layered printed circuit board 20 can be formed by stacking a plurality of individual printed circuit boards, each having the wiring pattern layer 23 formed by patterning a Cu foil attached to either surface or both surfaces of the board body. In this embodiment of the present invention, the printed circuit board 20 is formed by stacking three boards as shown to include four-layered conductive pattern layers 23.

As described in detail, the upper wiring layer 30 includes the chip-mounting portion 34 for mounting the semiconductor chip 10, board pads 35 formed around the chip-mounting portion 34 and electrically connected to the semiconductor chip 10 by the bonding wires 50, the upper heat dissipation layer 36 formed on the periphery of the encapsulant 34. In this embodiment, the upper heat dissipation layer 36 is discontinuously formed. The power layer 31 and the ground layer 32 are formed in order within the board body 21 and disposed horizontal to the upper surface 22 of the board body 20. Herein, although the power layer 31 is formed above the ground layer 32, this order may be changed. The lower wiring layer 33 includes a lower heat dissipation layer 37 corresponding to the chip-mounting portion 34 of the upper wiring layer 30, and solder ball pads 38 formed on the periphery of the lower heat dissipation layer 37 and electrically interconnected to the board pads 35 of the upper wiring layer 30.

The via holes 25 comprise signal via holes 40 and thermal emissive via holes 41. The signal via holes 40 connect the board pads 35 to the solder ball pads 38 and are isolated from the ground layer 32. Among the electrode pads 12 of the semiconductor chip 10, a power terminal 12a is connected to the power layer 31 through a signal via hole 40a. The heat-dissipating via holes 41 comprise first heat-dissipating via holes 42 which perforate the board body 21 in a region between the chip-mounting portion 34 and the lower heat dissipation layer 37, and second heat-dissipating via holes 43 which perforate the board body in a region of the upper heat dissipation layer 36. In order to maximize heat emission capacity, the first heat-dissipating via holes 42 and the second heat-dissipating via holes 43 are connected to the ground layer 32.

Inner walls of the via holes 25 are electroless-plated with Cu. Alternatively, in order to improve heat emission capacity (heat conduction) of the heat-dissipating via holes 41, the heat-dissipating via holes 41 may be filled with a metal having excellent thermal conductivity. Preferably, a low melting-pointed metal having excellent thermal conductivity is used as the filling metal.

In order to protect the board body 21 and the metal pattern layers 23, the surfaces of the board body 21 are applied with a solder resister 27. Then, the solder resister 27 is removed from the board pads 35 and the upper heat dissipation layer 36 of the upper surface 22, and from the solder ball pads 38 of the lower surface 24.

The lower surface of the semiconductor chip 10 is attached to the chip-mounting portion 34 of the printed circuit board 20. A plurality of the electrode pads 12 are formed on the upper surface of the semiconductor chip 10.

The electrode pads 12 of the semiconductor chip 10 are interconnected with the board pads 35 by the bonding wires 50. After the wire bonding, in order to protect the semiconductor chip 10, the bonding wires 50 and the upper wiring layer 30, the upper surface 22 of the printed circuit board 20 is molded with a molding resin such as a thermosetting resin, thereby to form the encapsulant 60. Then, flux is applied on the solder ball pads 38, and the solder balls 80 are mounted on the solder ball pads 38 and reflowed.

In the BGA package 100 of this embodiment of the present invention, the lower surface of the heat sink 70 is attached to the upper surface of the encapsulant 60. And, the lower surface of the heat sink 70 is attached to the upper heat dissipation layer by interposing a thermally conductive member 90 therebetween. Thereby, heat is effectively dissipated through the heat sink 70. The thermally conductive member 90 in a rod shape has the same length as that of the encapsulant 60 and are discontinuously formed on the upper heat dissipation layer 36. Preferably, the thermally conductive member 90 is made of a metal having a good thermal conductivity, for example, Fe alloy or Cu alloy.

In order to more effectively dissipate the heat generated from the BGA package 100, first heat-dissipating solder balls 84 may be further attached to the lower heat dissipation layer 37 connected to the first heat-dissipating via holes 42. Heat-dissipating solder ball pads 39 are formed on the lower surface 24 of the board body 20 correspondingly to the second heat-dissipating via holes 43, and second heat-dissipating solder balls 86 are further attached to the heat-dissipating solder ball pads 39. Herein, the solder resister 27 is not applied on the lower heat dissipation layer 37 attached with the first heat-dissipating solder balls 84 and on the heat-dissipating solder ball pads 39 attached with the second heat-dissipating solder balls 86. Although this first preferred embodiment of the present invention discloses both the first and the second heat-dissipating solder balls 84, 86, if necessary, either or neither of them may be employed.

The heat generated from the semiconductor chip 10 molded with the encapsulant 60 is dissipated via five routes as follows. First, heat is dissipated via the encapsulant 60 and the heat sink 70 attached to the encapsulant 60. Second, heat is dissipated via the chip-mounting portion 34 and the ground layer 32 connected to the first heat-dissipating via holes 42 below the chip-mounting portion 34. Third, heat is dissipated via the lower heat dissipation layer 37 connected to the first heat-dissipating via holes 42 and the first heat-dissipating solder balls 84. Fourth, heat is dissipated via the second heat-dissipating via holes 43 connected to the ground layer 32, and the heat sink 70. Fifth, heat is dissipated via the second heat-dissipating solder balls 86 connected to the second heat-dissipating via holes 43.

Figure 3:
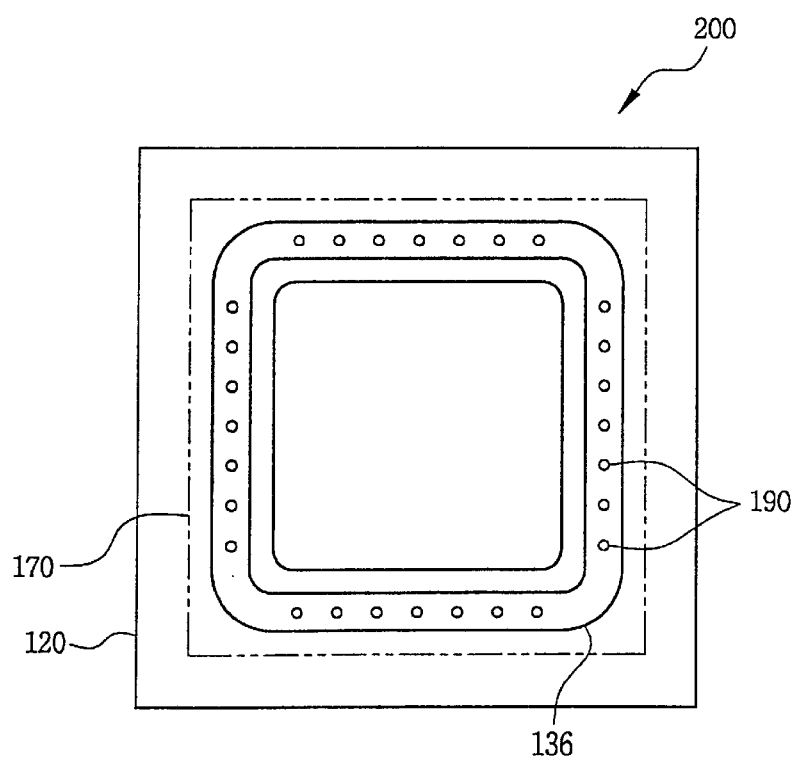
FIG. 3 is a plan view of a BGA package in accordance with another embodiment of the present invention, showing an upper heat dissipation layer in a ring shape disposed along the periphery of an encapsulant.

FIG. 3 is a plan view of a ball grid array package 200 in accordance with a second preferred embodiment of the present invention, showing an upper heat dissipation layer 136 in a ring shape formed along the periphery of an encapsulant 160. As shown in FIG. 3, the BGA package 200 has the same configuration as that of the BGA package 100 except that the upper heat dissipation layer 136 of the BGA package 200 is continuously formed along the periphery of the encapsulant 160 in a ring shape.

In accordance with the present invention, since there are many routes for dissipating heat, the heat produced from the semiconductor chip within the encapsulant can be effectively dissipated. Among these routes, heat is mainly dissipated through a connection between the lower surface of the semiconductor chip and the heat sink, i.e., through the chip-mounting portion to which the lower surface of the semiconductor chip is attached, the first heat-dissipating via holes, the ground layer, the second heat-dissipating via holes, the upper heat dissipation layer and the thermally conductive members interposed between the upper heat dissipation layer and the heat sink.

Although the preferred embodiments of the present invention have been described in detail hereinabove, it should be understood that the many variations and/or modifications of the basic inventive concepts herein taught which may appear to those skilled in the art will still fall within the spirit and scope of the present invention as defined in the appended claims.

What is claimed is:

1. A semiconductor package comprising:
   a semiconductor chip having a plurality of electrode pads on its active surface;
   a printed circuit board, said semiconductor chip mounted thereon, the printed circuit board comprising:
      a board body having an upper surface and an opposing lower surface;
      an upper wiring layer formed on the upper surface of the board body, the upper wiring layer including a chip-mounting portion for mounting the semiconductor chip, board pads formed around the chip-mounting portion and electrically connected to said semiconductor chip, and an upper heat dissipation layer around said chip-mounting portion; and a lower wiring layer including a lower heat dissipation layer formed on the lower surface of the board body;
      first heat-dissipating via holes formed through the board body between the chip-mounting portion and the lower heat dissipation layer, the first heat-dissipating via holes filled with a thermally conductive material for dissipating heat from the chip through the board body toward the lower wiring layer;
      second heat-dissipating via holes formed through the board body below said upper heat dissipation layer, the second heat-dissipating via holes filled with a thermally conductive material for dissipating heat generated from the chip through the board body toward the upper heat dissipation layer; and
      an electrically insulating encapsulant covering said semiconductor chip; and
      a heat sink thermally connected to the encapsulant, and wherein a lower surface of said heat sink is thermally connected to the upper heat dissipation layer.

2. The package of claim 1, wherein a ground layer is formed within said board body, and said first and second heat conduction holes are thermally connected to the ground layer.

3. The package of claim 1, wherein the lower wiring layer further includes solder ball pads electrically connected to the board pads.

4. The package of claim 3, further comprising signal via holes formed through the board body, the signal via holes connecting the board pads to said solder ball pads and isolated from the ground layer.

5. A ball grid array (BGA) package comprising:
   a semiconductor chip comprising a plurality of electrode pads on its active surface;
   a printed circuit board, said semiconductor chip mounted thereon;
   an electrically insulating encapsulant covering said semiconductor chip; and
   a heat sink thermally connected to an upper surface of said encapsulant,
   wherein said printed circuit board comprises:
      a board body having a lower surface and an opposing upper surface;
      an upper wiring layer formed on the upper surface of said board body, the upper wiring layer including a chip-mounting portion for mounting said semiconductor chip, board pads formed around said chip-mounting portion and electrically connected to said semiconductor chip, and an upper heat dissipation layer on a periphery of said encapsulant;
      a ground layer formed within said board body; and
      a lower wiring layer formed on the lower surface of said board body and having
      solder ball pads electrically connected to said board pads;
      signal via holes perforating said board body and connecting said board pads to said solder ball pads, said signal via holes being isolated from said ground layer;
      first heat-dissipating via holes perforating said board body below said chip-mounting portion and connecting to said ground layer; and
      second heat-dissipating via holes perforating said board body below said upper heat dissipation layer and connecting to said ground layer.

6. The BGA package of claim 5, wherein a lower surface of said heat sink is thermally connected to said upper heat dissipation layer and to said encapsulant.

7. The BGA package of claim 5, further comprising signal solder balls formed on said solder ball pads.

8. The BGA package of claim 5, wherein said upper heat dissipation layer includes plural discrete segments arranged around the periphery of said encapsulant.

9. The BGA package of claim 5, wherein said upper heat dissipation layer comprises a closed ring around the periphery of said encapsulant.

10. The BGA package of claim 5, wherein said heat sink is thermally connected to the upper heat dissipation layer by interposing therebetween a plurality of thermally conductive columns spaced at a predetermined interval.

11. The BGA package of claim 5, wherein said lower wiring layer further comprises a lower heat dissipation layer formed on the lower surface of said board body where said first heat-dissipating via holes are formed, and first heat-dissipating solder balls are attached to said lower heat dissipation layer.

12. The BGA package of claim 5, further comprising heat-dissipating solder ball pads formed on the lower surface of said board body corresponding to the second heat-dissipating via holes, and second heat-dissipating solder balls are attached to said heat-dissipating solder ball pads.

13. The BGA package of claim 5, further comprising a power layer formed within said board body and parallel to said ground layer, wherein one of said signal via holes connected to a power terminal of said electrode pads of said semiconductor chip is electrically connected to said power layer.

14. The BGA package of claim 5, wherein said first and said second heat-dissipating via holes are isolated from said power layer.

* * * * *